United States Patent [19]

Veurman et al.

[11] Patent Number: 4,891,472

[45] Date of Patent: Jan. 2, 1990

[54] INTERCONNECTS ON A PRINTED CIRCUIT BOARD HAVING CONNECTING POINTS FOR AN ELECTRONIC COMPONENT WITH A PLURALITY OF TERMINALS

[75] Inventors: Johannes Veurman, Winterswijk, Netherlands; Bernd Boeing, Bocholt, Fed. Rep. of Germany

[73] Assignee: Siemens Aktiengesellschaft, Berlin and Munich, Fed. Rep. of Germany

[21] Appl. No.: 237,337

[22] Filed: Aug. 29, 1988

[30] Foreign Application Priority Data

Sep. 10, 1987 [DE] Fed. Rep. of Germany ....... 3730455

[51] Int. Cl.[4] .......................... H05K 1/00; H05K 3/34
[52] U.S. Cl. ................... 174/68.5; 228/180.2; 361/409
[58] Field of Search ................ 174/68.5; 228/180.1, 228/180.2; 361/409

[56] References Cited

U.S. PATENT DOCUMENTS

| | | | |
|---|---|---|---|
| 3,921,888 | 11/1975 | Elliott et al. | 228/180.1 |
| 4,339,784 | 7/1982 | Shearer | 174/68.5 X |
| 4,530,457 | 7/1985 | Down | 228/180.2 |

*Primary Examiner*—Morris H. Nimmo
*Attorney, Agent, or Firm*—Hill, Van Santen Steadman & Simpson

[57] ABSTRACT

Interconnects on a printed circuit board having connecting points for an electronic component with a plurality of terminals are arranged on a printed circuit board so that a joining of a component and the printed circuit board can be accomplished in an automatic manufacturing unit. The joining of the component and the printed circuit board is accomplished by using flow soldering, in which the connecting points are arranged at a 45° angle relative to an output direction of the printed circuit board in a solder bath. The printed circuit board has draw-off surfaces that have larger dimensions than the individual connecting points that are arranged in a rectangle. These draw-off surfaces are located in corner regions of the connecting points.

4 Claims, 1 Drawing Sheet

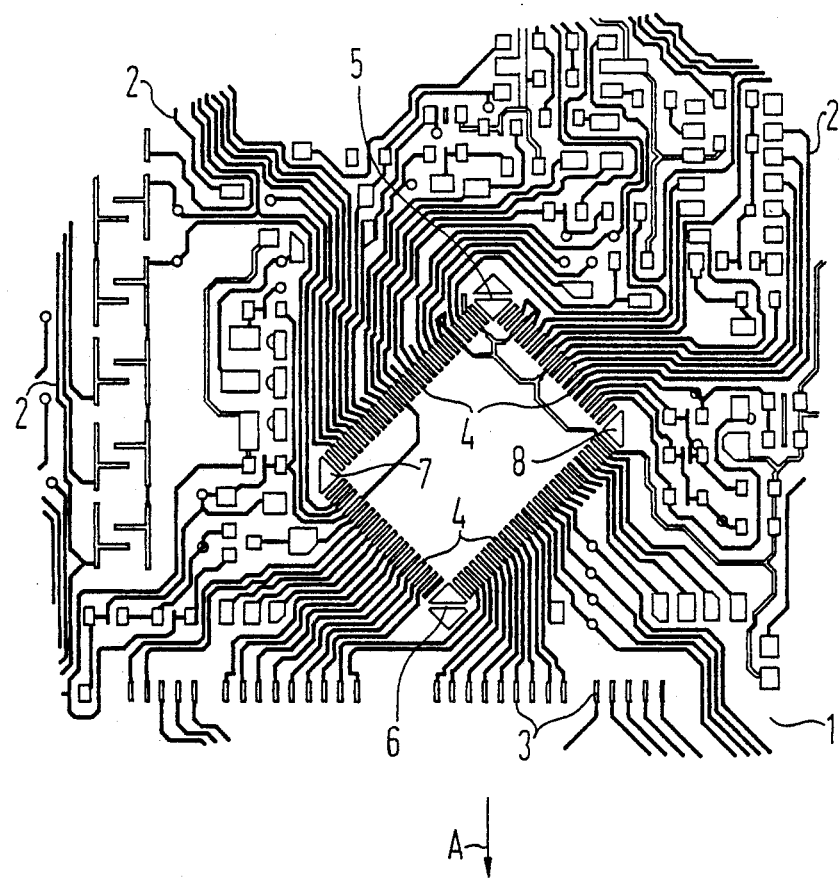

INTERCONNECTS ON A PRINTED CIRCUIT BOARD HAVING CONNECTING POINTS FOR AN ELECTRONIC COMPONENT WITH A PLURALITY OF TERMINALS

BACKGROUND OF THE INVENTION

1. Field of the Invention

The present invention relates to interconnects on a printed circuit board that have connecting points for an electronic component with a plurality of terminals, and the pre-plated connecting points are arranged in a rectangle.

2. Description of the Prior Art

Conventional techniques of attaching an electronic component having a plurality of terminals to a printed circuit board involve positioning the electronic component relative to the connecting points that are already pre-plated, and subsequently joining individual connecting points to the terminals of the component by heating. This heating is conventionally carried out with heated forceps that apply solder to each connecting point. This technique, however, has a disadvantage of a relatively high expenditure in terms of time and cost. Securing the component to the printed circuit board using flow soldering, which is also referred to as wave soldering, has a disadvantage of solder bridges forming between adjacent connecting points that are very close to each other. Such solder bridges have to be removed manually with a great expenditure of time.

SUMMARY OF THE INVENTION

It is an object of the present invention to provide interconnects on a printed circuit board having connecting points for an electronic component with a plurality of terminals such that a joining of a component part to the printed circuit board can be accomplished in an automatic unit.

This object is achieved in accordance with the principles of the present invention by positioning the terminals of the component at the correct attitude relative to the connecting points and joining the terminals of the component to the connecting points of the printed circuit board using a flow soldering method. The connecting points are situated at a 45° angle relative to an output direction of the printed circuit board in a solder bath. Draw-off surfaces are located in corner regions of the connecting points, and these draw-off surfaces have larger dimensions than the individual connecting points. Since the connecting points proceed at a 45° angle relative to the output direction of the printed circuit board in the solder bath, solder bridges only form in the corner regions of the connecting points that are arranged in a rectangle. In order to keep the solder that causes the bridges away from the connecting points situated in these corner regions, the draw-off surfaces having larger dimensions than the connecting points are located in the corner regions. The larger dimensions of the draw-off surfaces create a higher surface tension than the connecting points. This causes the excess solder on the connecting points to be drawn to the draw-off surfaces.

In flow soldering, the application of solder is usually the greatest in the central region of the solder bath. Therefore, the draw-off surfaces lying in the output direction of the printed circuit board have a larger surface area than the draw-off surfaces arranged perpendicular to the output direction.

BRIEF DESCRIPTION OF THE DRAWING

The FIGURE is a plan view of a printed circuit board constructed in accordance with the principles of the present invention.

DESCRIPTION OF THE PREFERRED EMBODIMENTS

The FIGURE is a plan view of a printed circuit board 1 constructed in accordance with the principles of the present invention. A plurality of interconnects 2 and connecting points or pads 3 and 4 for electronic component parts are located on the printed circuit board 1.

In an embodiment shown in the figure, a multi-terminal, rectangularly shaped electronic component, such as a microprocessor, is positioned relative to the pre-plated connecting points 4 to be joined to the printed circuit board 1. Output direction "A" of the printed circuit board 1 over the solder bath is indicated with a directional arrow. The connecting points 4 that are arranged in a rectangle are situated at a 45° angle relative to the output direction "A".

Since bridges between the closely adjacent connecting points 4 (in the range of a millimeter) predominately form in corner regions during flow soldering, draw-off surfaces 5, 6, 7 and 8 that absorb excess solder are provided in order to avoid such undesired bridge formations. These draw-off surfaces 5, 6, 7 and 8 are significantly larger than the connecting points 4 for the microprocessor and have a triangular design in this embodiment. Since the largest amount of solder is applied at a central region of the solder bath, the draw-off surfaces 5 and 6 are larger than the draw-off surfaces 7 and 8, enabling draw-off surfaces 5 and 6 to attract more solder than the draw-off surfaces 7 and 8.

Although modifications and changes may be suggested by those skilled in the art, it is the intention of the inventors to embody within the patent warranted hereon all changes and modifications as reasonably and properly come within the scope of their contribution to the art.

We claim as our invention:

1. A printed circuit board for minimizing formation of solder bridges between closely adjacent contacts for rectangular, multi-terminal electronic components during flow soldering in a solder bath by moving said circuit board in a direction relative to said solder bath, comprising:

a plurality of connecting points on said printed circuit board arranged in a rectangle, said connecting points positioned relative to terminals of multi-terminal electronic components to make a solder connection with said terminals during said flow soldering;

a plurality of draw-off surfaces for attracting excess solder accumulated during said flow soldering respectively located at corners of said rectangle formed by said connecting points; and said connecting points being disposed at an angle of 45° relative to said output direction so that a portion of said plurality of draw-off surfaces lie opposite each other in said output direction and a portion of said plurality of draw-off surfaces lie opposite each other perpendicularly to said output direction, and wherein said draw-off surfaces in said output direction are larger than said draw-off surfaces perpendicular to said output direction.

2. A printed circuit board configuration as claimed in claim 1, wherein said draw-off surfaces are triangular.

3. A method of minimizing formation of solder bridges between closely adjacent contacts for rectangular, multi-terminal electronic components on a printed circuit board during flow soldering, comprising the steps of:

arranging a plurality of connecting points on a printed circuit board in a rectangle positioned relative to terminals of multi-terminal electronic components to make solder connections with said terminals during said flow soldering;

positioning a plurality of draw-off surfaces for attracting excess solder accumulated during said flow soldering at corners of said rectangle formed by said connecting points;

disposing said connecting points at an angle of 45° relative to said output direction so that a portion of said plurality of draw-off surfaces lie opposite each other in said output direction and a portion of said plurality of draw-off surfaces lie opposite each other perpendicular to said output direction;

making said draw-off surfaces perpendicular to said output direction;

conducting said flow soldering in a solder bath; and moving said printed circuit board in an output direction relative to said solder bath.

4. A method of minimizing formation of solder bridges between closely adjacent contacts as claimed in claim 3, further comprising the step of:

constructing said draw-off surfaces triangular.

* * * * *